United States Patent
Le Gouil

(10) Patent No.: US 6,295,199 B1
(45) Date of Patent: Sep. 25, 2001

(54) ELECTRONICS MODULE AND A METHOD OF MANUFACTURING SUCH A MODULE

(75) Inventor: Jean-Yves Le Gouil, Jouy-le-Moutier (FR)

(73) Assignee: Sagem SA, Paris (FR)

( * ) Notice: Subject to any disclaimer, the term of this patent is extended or adjusted under 35 U.S.C. 154(b) by 0 days.

(21) Appl. No.: 09/637,864

(22) Filed: Aug. 15, 2000

(30) Foreign Application Priority Data

Aug. 26, 1999 (FR) .................................................. 99 10815

(51) Int. Cl.[7] .......................................................... H05K 7/20
(52) U.S. Cl. .......................... 361/698; 361/689; 361/699; 361/704; 361/711; 257/714; 174/15.1; 165/80.4
(58) Field of Search ..................................... 361/689, 690, 361/691, 698, 699, 700, 704, 719; 174/15.1, 16.1, 16.3, 52.4; 165/80.3, 80.4, 185, 104.33; 257/706, 714, 721, 722

(56) References Cited

U.S. PATENT DOCUMENTS

| | | |
|---|---|---|
| 3,165,672 | 1/1965 | Gellert . |
| 4,120,019 * | 10/1978 | Arii et al. .............................. 361/699 |
| 4,381,032 * | 4/1983 | Cutchaw ................................. 165/46 |
| 4,706,164 | 11/1987 | L'Henaff . |
| 4,893,590 * | 1/1990 | Kashimura et al. ............... 123/41.31 |
| 5,001,601 * | 3/1991 | Fuoco .................................... 361/699 |
| 5,251,100 * | 10/1993 | Fujita et al. .......................... 361/719 |
| 5,605,715 | 2/1997 | Giardina et al. . |

FOREIGN PATENT DOCUMENTS

| | | |
|---|---|---|
| 1 063 226 | 8/1959 | (DE) . |
| 0 197 817 | 3/1985 | (EP) . |

OTHER PUBLICATIONS

IBM Technical Disclosure Bulleting, US, IBM Corp., vol. 34, No. 12, May 1, 1992; pp. 387–388.

* cited by examiner

*Primary Examiner*—Leo P. Picard
*Assistant Examiner*—Boris L. Chervinsky
(74) *Attorney, Agent, or Firm*—Larson & Taylor, PLC

(57) ABSTRACT

The module has a metal substrate having one major face that is insulated and that carries electrical connection tracks, and at least one power component fixed to the substrate and having connection tabs (20) that are soldered to the tracks. The power component is fixed on the non-insulated face and it is placed in a housing constituting an inside wall of a cooling fluid circuit, or it is stuck thereto. The tabs of the component pass through the substrate via holes therein.

12 Claims, 1 Drawing Sheet

ELECTRONICS MODULE AND A METHOD OF MANUFACTURING SUCH A MODULE

BACKGROUND OF THE INVENTION

The present invention relates to an electronics module comprising a substrate and at least one electronic power component that needs cooling. A particularly important, although non-exclusive, application of the invention lies in the field of motor vehicle electronics where some systems incorporate power components, e.g. coils or capacitors, which generate large amounts of heat in operation and which are located in a high-temperature environment.

The invention relates more particularly to a module comprising a metal substrate having one face that is insulated and that carries electrical connection tracks, with at least one power component fixed to the substrate and having junction tabs soldered to the tracks. Such substrates are now in use where the face is insulated by forming an insulating layer, e.g. by oxidizing, nitriding, or anodizing. Until now, the components have usually been mounted on the insulated face side of the substrate, and this does not give rise to any problem for components that are thin and that dissipate little heat. In contrast, mounting power components on this face, opposite from the non-insulated face against which a cooling fluid is caused to circulate, gives rise to a considerable increase in the size of the module.

SUMMARY OF THE INVENTION

An object of the present invention is to provide a cooled power electronics module of reduced bulk. To this end, there is provided a module in which the power component(s) is/are fixed on the non-insulated face and is/are placed in a housing constituting an inside wall of a cooling fluid circuit or is/are bonded to such a wall, and its tabs pass through the substrate via holes therein.

As a general rule, the power component will be coated in resin, enabling heat to be dissipated towards the housing which may be electrically insulating. When the housing is stuck to the inside wall of the cooling circuit, the resin used will generally be of the same kind as the resin used for adhesive purposes.

The connection tabs may be insulated so as to make it simpler to pass them through the substrate. Nevertheless, it is also possible to use bare metal tabs providing the walls of the holes are insulated (e.g. by being oxidized) or an insulating eyelet is interposed between each tab and the wall of the corresponding hole.

There is also provided a method of manufacturing an electronics module, in which a metal substrate is formed having one face that is insulated, and that carries electrical connection tracks, the substrate being pierced by through holes, a power component is mounted on the non-insulated wall of the substrate with connection tabs of the component passing through holes in the substrate, and the tabs are soldered to areas of the tracks located close to the holes.

To facilitate mounting the power component and fixing of its tabs, the tabs are advantageously preformed prior to mounting of the component, and the holes are of a size that is sufficient to allow the angled tabs to pass therethrough. In particular, holes can be provided having a broad portion for allowing a tab to pass through and a narrow portion into which the tab is brought by moving the component sideways prior to soldering the tabs. The component can be provided with a peg designed to engage in an oblong hole of the substrate and to snapfasten therein when the component is in its final position so as to hold the component temporarily until it has been soldered, with soldering being performed by a reflow technique, for example.

BRIEF DESCRIPTION OF DRAWINGS

The above characteristics of the invention and others will appear more clearly on reading the following description of a particular embodiment, given by way of non-limiting example.

DESCRIPTION OF THE INVENTION

Figure 2:
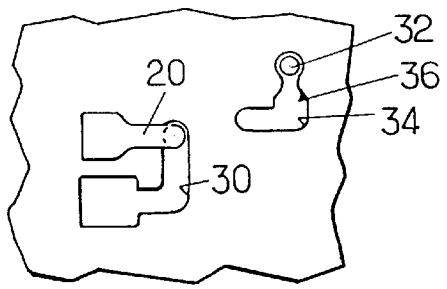
FIG. 2 is a plan view showing one possible shape for the tabs of a power component and for the holes made in the substrate.

The module shown in part in FIG. 2 comprises a metal substrate 10, e.g. made of aluminum and constituted by a plate having one of its faces covered in an insulating layer. By way of example, this layer can be constituted by surface oxidation which can be obtained by anodizing treatment. The thickness of the layer 12 can be limited to a few tens of microns. The figure shows an electronic component 14 mounted on the insulating face of the substrate 10 in conventional manner. The insulating layer 12 carries metallized tracks 16 constituting equipotential links to which the various components carried by the substrate are connected by soldering.

In addition to components that convey low power signals only, the module carries one or more power components 18, such as chokes, coils, capacitors, etc., for example. By way of example, the component 18 shown is constituted by a coil having two connection tabs 20. The coil is potted in a resin coating, e.g., Araldite, optionally containing fillers for increasing its thermal conductivity. This coil is contained in a housing 22 whose outside face at least presents a good surface condition so as to facilitate heat transfer with the inside wall 24 of a water tank 26 designed to cool the power components. A coating resin 28, likewise having fillers to make it conduct heat, secures the housing to the inside wall 24 of the water tank. The water tank 26 is closed by a cover 27, e.g., soldered in place and it has couplings such as 29 for liquid flow and forming part of a cooling liquid circuit indicated schematically at 31.

The connection tabs 20 of the component 18 pass through holes 30 in the substrate 10. These tabs can be made of enamelled copper, thus avoiding any need to provide a layer of insulation on the walls of the holes. The tabs 20 are angled so that their end portions can be pressed flat against soldering areas provided in the tracks 16.

Figure 1:
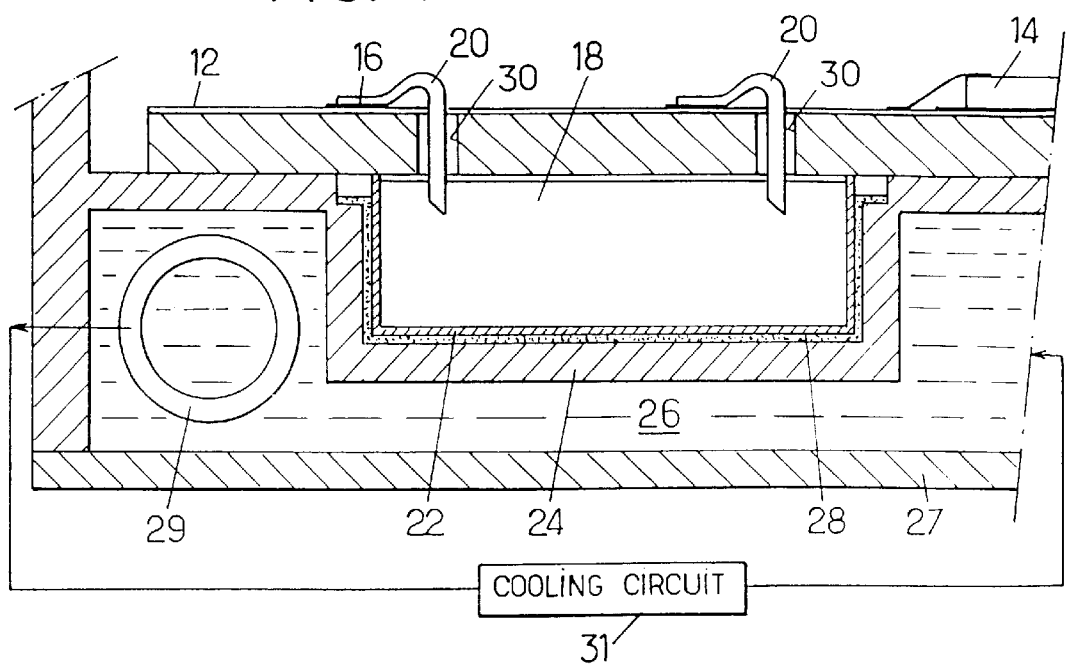
FIG. 1 is a simplified section view of a fraction of a module of the invention, not drawn to scale for greater clarity.

To facilitate assembly, the tabs 20 are advantageously preformed and angled all in the same direction, as shown in FIG. 1. To enable the components to be mounted, the holes 30 are then L-shaped, as shown in FIG. 2. To increase the connection surface area between the tracks 16 and the tabs 20, the end portions of the tabs can be spade-shaped and each hole 30 can be of a shape that matches the enlarged spade-shaped portion, as shown in FIG. 2.

To hold the components 18 in temporary manner until they are soldered, one solution consists in providing each of them with one or more studs or pegs 32 which engage in holes 34 in the substrate 10. Each of these holes can have a narrow portion 36 for snap-fastening the stud in the position shown in FIG. 2. In this way, the tabs of the mounted component are held pressed against the connection areas, which are generally coated in a soldering material so as to enable soldering to be performed in conventional manner by a reflow technique.

Figure 3:
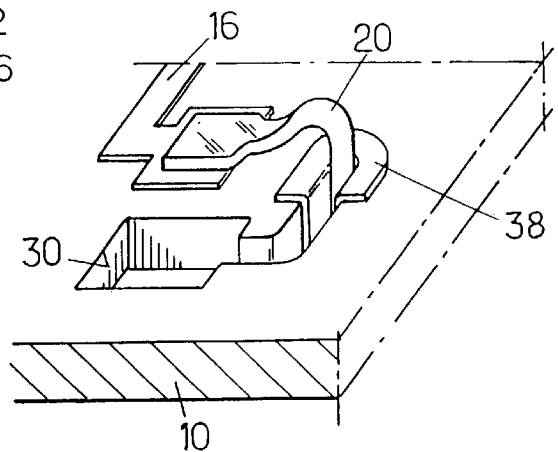
FIG. 3 shows one possible shape for tab-insulating eyelets.

In the modified embodiment shown in FIG. 3, eyelets 38 of insulating material are interposed between the tabs 20 and the walls of the holes 30, thereby making it possible to use tabs that are not insulated.

The invention makes it possible to mount power components on aluminum substrates that are a few millimeters thick, such components may having sizes in directions parallel to the substrate of several tens of millimeters and a thickness that may be greater than 10 mm, the bulk of such components would be in addition to the bulk of the water tank if they projected from the insulated face. The mounting technique described above has been used in particular to make modules having components such as coils which, in operation, generate power of 10 watts or more.

What is claimed is:

1. An electronics module comprising:

a metal substrate having a major face that has an insulating layer thereon and that carries a plurality of electrical connection tracks and a non-insulated major face, and at least one power component fixed on the non-insulated major face of the substrate and having connection tabs which pass through the substrate via holes therein and are electrically insulated from said substrate, said tabs being soldered to respective ones of said tracks, and a housing bonded to an inside wall of a cooling fluid circuit, said component being located inside said housing and in close contact therewith.

2. A module according to claim 1, wherein said power component is potted in a resin for heat transfer to the housing.

3. A module according to claim 2, wherein said resin is electrically insulating.

4. A module according to claim 3, wherein said housing is bonded to the inside wall of the cooling circuit by a bonding resin of the same nature as the potting resin.

5. A module according to claim 1, wherein the connection tabs have an insulating coating layer.

6. A module according to claim 1, wherein the holes have walls covered with an insulating surface layer.

7. A module according to claim 1, wherein insulating eyelets are interposed between each of said tabs and a wall of a corresponding one of said holes.

8. A module according to claim 1, wherein said connecting tabs are angled for their end portions to lie flat on said tracks and said holes are large enough to allow the angled tabs to pass therethrough.

9. A module according to claim 8, in which said holes each have an enlarged portion for allowing a tab to pass therethrough and a narrow portion sized for receiving the respective tab by moving the respective power component sideways.

10. A module according to claim 8, wherein said component has at least one peg sized to engage into an oblong hole of the substrate and to snap-fasten therein when the component is in a final position so as to hold the component temporarily until soldering has been performed.

11. An electronics module comprising a metal substrate having a major face that has an insulating layer thereon and that carries a plurality of electrical connection tracks for connection with electronic components carried by said insulated major face and a non-insulated major face, and at least one power component fixed on the non-insulated face of the substrate and having connection tabs which pass through the substrate via holes therein and are electrically insulated from said substrate, said tabs being soldered to respective ones of said tracks, and a housing constituting part of an inside wall of a cooling fluid circuit, said component being located inside said housing and in close contact therewith.

12. A module according to claim 11, wherein said connection tabs are angled for their end portions to lie flat on said tracks and said holes are large enough to allow the angled tabs to pass therethrough.

* * * * *